United States Patent
Arisaka et al.

(10) Patent No.: US 7,180,312 B2
(45) Date of Patent: Feb. 20, 2007

(54) PROBE CARD AND METHOD FOR MANUFACTURING PROBE CARD

(75) Inventors: Yoshikazu Arisaka, Kawasaki (JP);
Kunihiro Itagaki, Kawasaki (JP);
Shigenobu Ishihara, Kawasaki (JP);
Tomohiro Giga, Kawasaki (JP);
Naoyoshi Kikuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/395,208

(22) Filed: Mar. 25, 2003

(65) Prior Publication Data

US 2003/0184330 A1    Oct. 2, 2003

(30) Foreign Application Priority Data

Mar. 28, 2002    (JP) .............................. 2002-091138

(51) Int. Cl.
*G01R 31/02*    (2006.01)

(52) U.S. Cl. ...................................... 324/754; 324/761

(58) Field of Classification Search ................ 324/754, 324/758, 765, 158.1, 762, 761, 757; 29/842, 29/874, 889
See application file for complete search history.

(56) References Cited

U.S. PATENT DOCUMENTS

| | | | | |
|---|---|---|---|---|
| 5,491,891 A | * | 2/1996 | Isaac ............................ | 29/842 |
| 5,949,245 A | * | 9/1999 | Liu .............................. | 324/762 |
| 6,137,297 A | * | 10/2000 | McNair et al. ............. | 324/754 |
| 6,144,212 A | * | 11/2000 | Mizuta ........................ | 324/754 |
| 6,305,230 B1 | * | 10/2001 | Kasukabe et al. ............ | 73/855 |
| 6,617,863 B1 | * | 9/2003 | Kasukabe et al. .......... | 324/754 |
| 6,734,691 B2 | * | 5/2004 | Saijyo et al. ................ | 324/762 |

\* cited by examiner

*Primary Examiner*—Minh N. Tang
(74) *Attorney, Agent, or Firm*—Armstrong, Kratz, Quintos, Hanson & Brooks, LLP

(57) ABSTRACT

A probe card that is manufactured inexpensively. The probe card includes a base plate, a flexible substrate, and a contact probe. The contact probe is a flexible substrate formed from polyimide resin. The contact probe has a plurality of parallel wires. Each wire has a distal end that functions as a contact. The contact probe is produced by cutting a general purpose substrate having a plurality of parallel wires formed at a predetermined pitch. The number of the parallel wires is equal to the number of pads of an LSI chip.

15 Claims, 5 Drawing Sheets

PROBE CARD AND METHOD FOR MANUFACTURING PROBE CARD

CROSS-REFERENCE TO RELATED APPLICATION

This application is based upon and claims the benefit of priority from the prior Japanese Patent Application No. 2002-91138, filed on Mar. 28, 2002, the entire contents of which are incorporated herein by reference.

BACKGROUND OF THE INVENTION

1. Field of the Invention

The present invention relates to a probe card, which is used to perform a conduction test on a semiconductor device or other substrates, and to a substrate for manufacturing the substrate.

2. Description of the Related Art

A wafer test is normally performed when fabricating a semiconductor device. A probe card having a plurality of probe pins is used in the wafer test. A semiconductor having a plurality of pads is formed on the wafer substrate. The probe pins are each connected to an associated one of the pads. Various characteristics of the semiconductor device are measured in accordance with a predetermined conduction test program. A variety of probe cards having different configurations are known in the art, such as a cantilever type probe card and a patterning type probe card.

Recent semiconductors, such as LSIs, have higher integration, smaller pitches, and higher frequencies. Accordingly, there is a demand for LSI testing probe cards to have higher integration, smaller pitches, and higher frequencies.

FIG. 1 shows a contact probe 41 used in a patterning type probe card that answers such demand. The contact probe 41 includes an insulation plate 42, which is made of polyimide resin. A plurality of wires 43 are formed on the insulation plate 42 by performing lithography.

The width of each wire 43 continuously changes between the upper end where the width is relatively wide and the lower end where the width is relatively narrow. The lower end of the wire 43 functions as a contact 44, which extends downward from the insulation plate 42. The contact 44 is engaged with a pad of an LSI. The wires 43 are formed through a technique that requires the same accuracy as the wire printing technique performed when fabricating the LSI. Accordingly, the pitch of the contacts 44 in the contact probe 41, which is smaller than the pitch of probe pins in a cantilever type probe card, is optimal for performing conduction test an a highly integrated LSI.

Electric noises affect the conduction test and evaluation of the test result in an undesirable manner. To prevent noise, the contact probe 41 has through holes 45, which extend through the wide upper ends of predetermined wires 43 (at positions relatively separated from the contacts 44). The through holes 45 are used to connect the corresponding wires 43 to a ground layer (not shown). These wires 43 connect predetermined pads to the ground layer to avoids undesirable noise influence.

The contact probe 41 of FIG. 1 is connected to a plurality of pads, which are arranged along the four sides of an LSI chip, to test the LSI chip. A probe card has four of the probe cards 41 shown in FIG. 1 in correspondence with the four side of the LSI chip.

The probe card is manufactured in the following manner. First, as shown in FIG. 2, the wires 43 of the four contact probes are formed on an insulation film 47. Each contact probe 41 is formed by cutting the insulation in a trapezoidal manner.

The number of pads and the location of the pads connected to the ground differ between LSI types. Thus, the probe card must be changed in accordance with the LSI type. That is, in accordance with the LSI chip type, the number of wires formed on the insulation film 47 and the position of through holes must be must be changed in accordance with the type of LSI chip. Thus, the patterning type probe card is difficult to mass-produce and more expensive to produce in comparison to other types of probe cards.

As the number of times the contact probe 41 contacts the LSI pads increases, physical damage, such as breakage, may be inflicted on the contacts 44 thereby deteriorating the contact probe 41. When only one of the contacts 44 is damaged, it would be difficult to repair only the damaged contact 44. Thus, the whole contact probe 41 must be replaced.

As shown in FIG. 2, the wires of the four contact probes 41 are formed on the single insulation film 47. Thus, when one of the contact probes 41 is damaged, the damaged contact probe 41 is either repaired on replaced. However, the remaining three contact probes 41 cannot be used during this period. Accordingly, the cost for repairing the prior art probe card is high.

SUMMARY OF THE INVENTION

It is an object of the present invention to provide a probe card that is manufactured inexpensively and to provide a substrate of a probe card.

To achieve the above object, the present invention provides a probe card for performing an electric test on a chip having a plurality of pads. The probe card includes a contact probe having a plurality of contact wires and formed by cutting an insulation base material having a plurality of parallel wires. The number of the contact wires is equal to the number of the pads. The contact wires have distal ends, each of which functions as a contact that contacts an associated one of the pads.

A further perspective of the present invention is a probe card for performing an electric test on a chip having a plurality of pads. The probe card is provided with a contact probe including a signal layer having a plurality of parallel contact wires. The contact wires have distal ends, each of which functions as a contact that contacts an associated one of the pads. A first insulation layer is formed on the signal layer. A ground layer is formed on the first insulation layer. A first bonding wire connects the contact of a predetermined one of the contacts to the ground layer.

A further perspective of the present invention is a probe card for performing an electric test on a chip having a plurality of pads. The probe card is provided with a contact probe including a signal layer having a plurality of parallel contact wires. The contact wires have distal ends, each of which functions as a contact that contacts an associated one of the pads. An insulation layer is formed on the signal layer. A ground layer is formed on the insulation layer. A plurality of ground wires connect the ground layer to the contacts. A predetermined one of the ground wires is connected to a predetermined one of the contacts is cut.

A further perspective of the present invention is a substrate for producing a contact probe. The substrate includes a plurality of parallel wires having a predetermined pitch. The substrate is cut in accordance with the number of wires of the contact probe.

A further perspective of the present invention is a method for manufacturing a contact probe of a probe card used when conducting an electric test on a chip having a plurality of pads. The method includes preparing an insulation base material having a plurality of parallel wires, and cutting the insulation base material so that the contact probe has contact wires, the number of which is equal to the number of the pads.

Other aspects and advantages of the present invention will become apparent from the following description, taken in conjunction with the accompanying drawings, illustrating by way of example the principles of the invention.

DETAILED DESCRIPTION OF THE PREFERRED EMBODIMENTS

A probe card 1 according to a first embodiment of the present invention will now be discussed.

Figure 1:
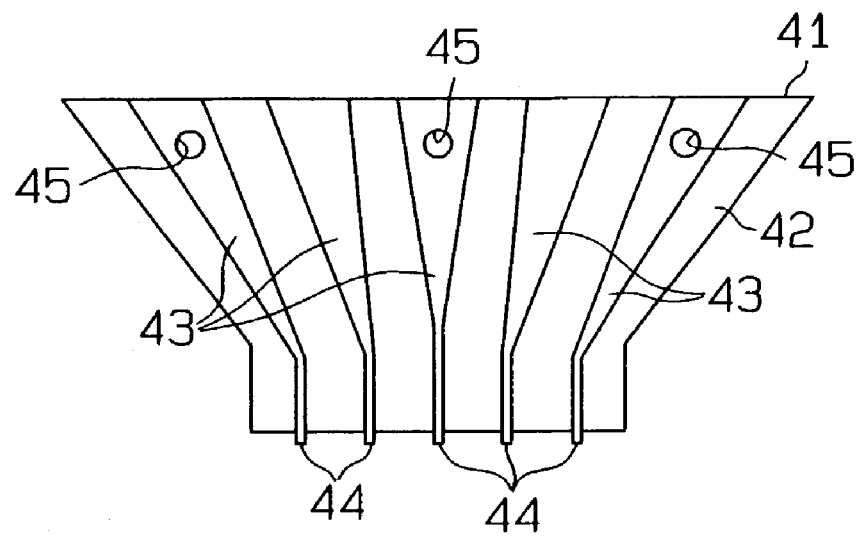
FIG. 1 is an explanatory diagram showing wires of a prior art probe.
Figure 2:
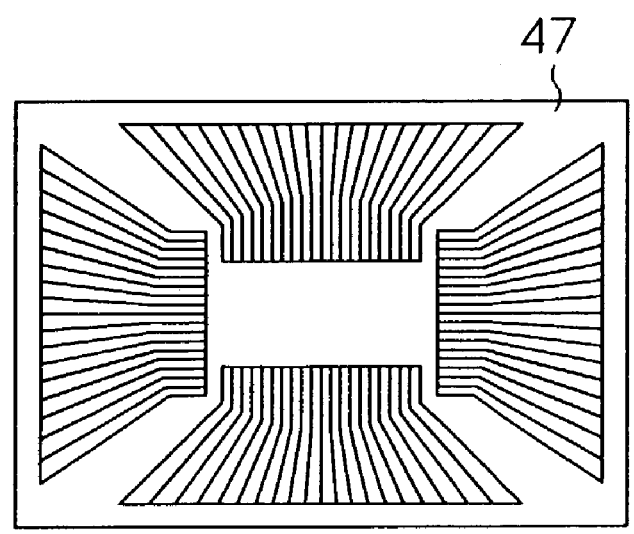
FIG. 2 is an explanatory diagram showing a prior art film substrate.
Figure 3:
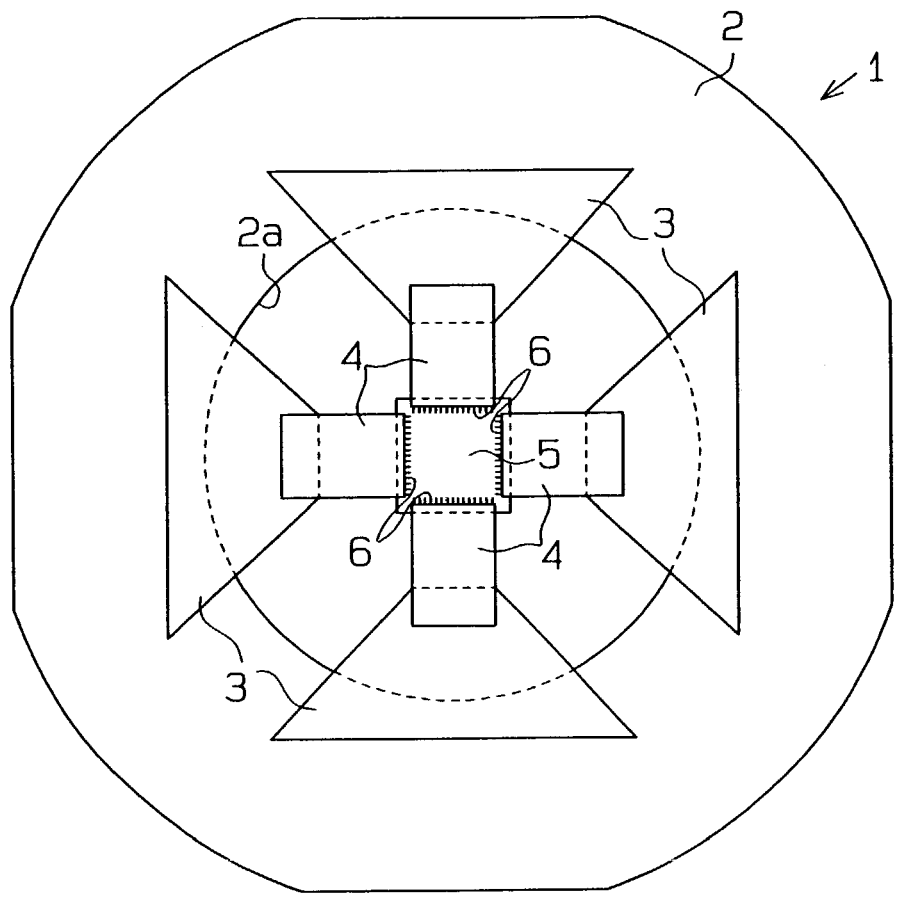
FIG. 3 is a schematic diagram showing a probe card according to a first embodiment of the present invention.
Figure 4:
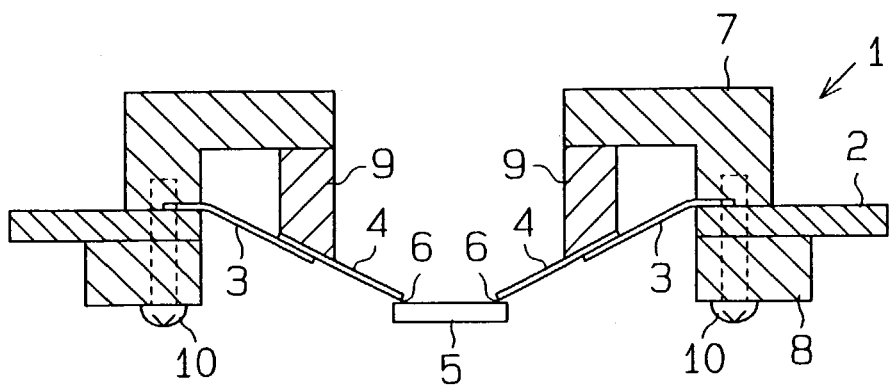
FIG. 4 is a cross-sectional view of the probe card of FIG. 3.

FIG. 3 is a plan view showing the probe card 1, and FIG. 4 is a cross-sectional view of the probe card 1. To facilitate understanding, a fastener 7 shown in FIG. 4 is not shown in FIG. 3.

As shown in FIG. 3, the probe card 1 includes a base plate 2, four flexible substrates 3 having basal ends (outer ends) fixed to the base plate 2, and four contact probes 4, each connected to an associated one of the flexible substrates 3. An LSI chip 5 is arranged at the center of the probe card 1. The LSI chip 5 is square and has bumps (projected electrodes that are not shown in the drawings) arranged along the four sides of the LSI chip 5. The flexible substrates 3 and the contact probes 4 are arranged in correspondence with the four sides of the LSI chip 5.

The base plate 2 is a plate formed from an insulative material. A round opening 2a is formed in the center of the base plate 2. A plurality of wires (not shown) are arranged around the opening 2a. The wires are connected to a tester via lands (not shown), which are formed along the edges of the base plate 2.

Each flexible substrate 3, which is a trapezoidal plate formed from an insulative material such as polyimide resin, has a relatively wide basal (outer) end and a relatively narrow distal end (inner end). The basal end is attached to the upper surface of the base plate 2, and the distal end is arranged in the opening 2a. Each flexible substrate 3 has a plurality of wires connecting the associated one of the contact probes 4 with the base plate 2. Photolithography is performed to form the wires so that the distance between adjacent wires is smaller at positions closer to the distal end of the flexible substrate 3 and greater at positions closer to the basal end. In other words, the wires of the flexible substrate 3 extend radially about the center of the base plate 2.

Each contact probe 4 is a rectangular plate made of an insulative material such as polyimide resin. Photolithography is performed to form a plurality of wires on the contact probe 4. The wires extend parallel to one another in the longitudinal direction of the contact probe 4. The basal ends of the wires are electrically connected to corresponding wires of the associated flexible substrate 3. The distal end of each wire functions as a contact (contact pin) 6, which extends from the polyimide resin plate.

As show in FIG. 4, the base plate 2 is fixed between an upper fastener 7 and a lower fastener 8 by screws 10. The basal end of each flexible substrate 3 is fixed between the upper surface of the base plate 2 and the upper fastener 7 by the screws 10. Brackets 9 are fixed to the upper fastener 7. The lower end surface of each bracket 9 is inclined at a predetermined angle. The distal end of each flexible substrate 3 is connected to the basal end of the associated contact probe 4. The upper surface (connecting portion) of the basal end of the contact probe 4 is fixed to the lower end surface of the bracket 9. Thus, the contacts 6 of the contact probe 4 contact the LSI chip 5 at a predetermined angle.

The contact probes 4 will now be described.

Figure 5A:
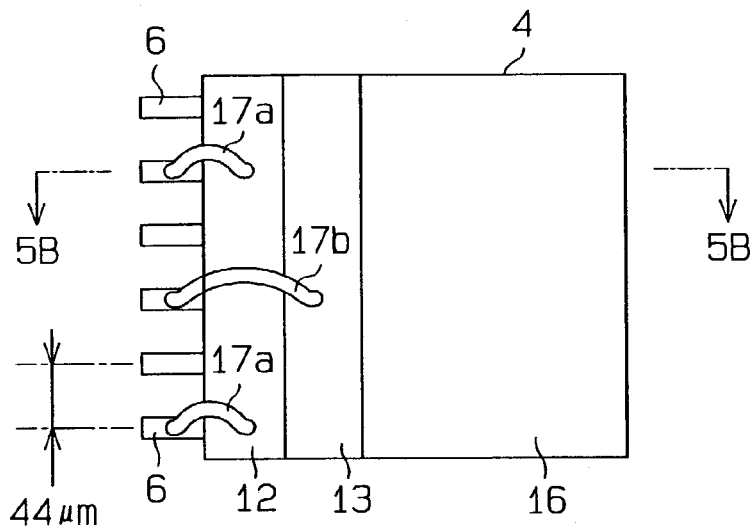
FIG. 5A is a plan view of a contact probe.
Figure 5B:
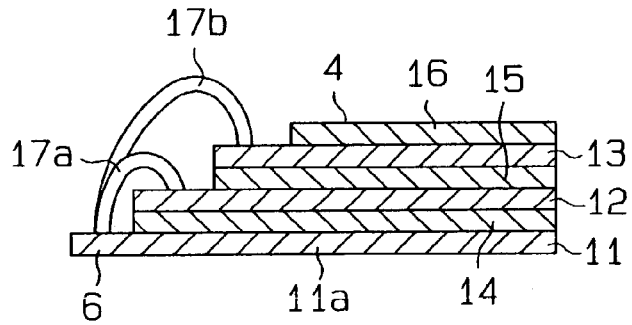
FIG. 5B is a cross-sectional view of the contact probe of FIG. 5A.

As shown in FIGS. 5A and 5B, each contact probe 4 is a three-layer structure including a signal layer 11, a ground layer 12, and a power supply layer 13. A plurality of contact wires 11a are arranged in parallel at a predetermined wiring pitch (44 μm) on the signal layer 11, which is the lowermost layer. The ground layer 12 is formed above the signal layer 11 with an insulation layer 15, which is made of polyimide, arranged in between. A power supply layer 13 is formed above the ground layer 12 with an insulation layer 15 arranged in between. An insulation layer 16 is formed on the power supply layer 13. The ground layer 12 and the power supply layer 13 are thin films formed from a metal such as copper (Cu). That is, the ground layer 12 is a planar type ground electrode, and the power supply layer 13 is a power supply electrode.

The cross-section of the contact probe 4 near the distal end (vicinity of the contacts 6) is stepped so that part of the ground layer 12 and the power supply layer 13 are exposed. The contact wires 11a each have a distal end (left end as viewed in FIG. 5), or the contact 6, which is exposed from the insulation layer 14 and extended from the left side of the insulation layer 14. The contacts 6 contact the LSI chip 5.

As shown in FIG. 5A, some of the contacts 6 are electrically connected to the ground layer 12 or the power supply layer 13 by bonding wires 17a, 17b, which are formed from aluminum (Al) or gold (Au). This reinforces the connection between the contacts 6 and the ground and between the contacts 6 and the power supply. Thus, the contact probe 4 is subtly affected by noise.

Figure 6:
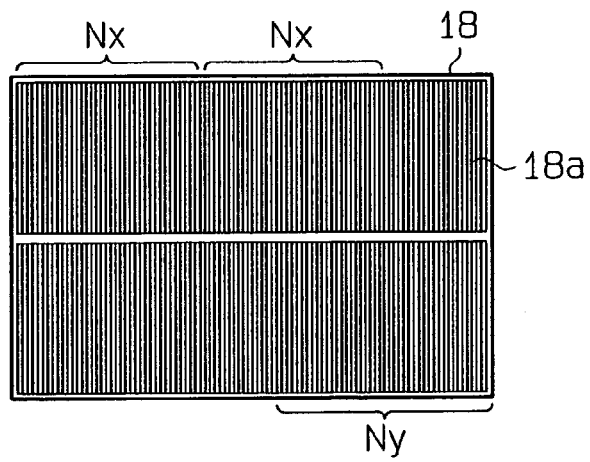
FIG. 6 is an explanatory diagram of a general-purpose substrate.

The bonding wires 17a are used in lieu of through holes to connect the contacts 6 to the ground layer 12. Thus, the contact probe 4 may be cut out from an insulation base material (general purpose substrate) 18, which is shown in FIG. 6.

The general purpose substrate 18 undergoes photolithography to form a plurality of contact probe wires 18a, which extend parallel to the short side of the substrate 18. Two columns of the wires 18a are formed along the long side of the general purpose substrate 18. The general purpose substrate 18 is a flexible substrate including the signal layer 11, on which the wires 18a are formed, the insulation layer 14, the planar type ground layer 12, the insulation layer 15, and the planar type power supply layer 13. The length of the short side of the general purpose substrate 18 is about two times the length of the contact probe wires. Each of the wires 18a is a linear wire having a predetermined width. It is preferred that the number of the wires 18a formed along the long side of the general purpose substrate 18 be greater than the number of pads arranged on one side of the LSI chip 5. If the number of the wires 18a is the same as the number of pads arranged on one side of the LSI chip 5, the general purpose substrate 18 does not have to be cut to produce the contact probe 4.

The number of pads on each side of the LSI chip 5 is determined during the designing stage. To produce the contact probes 4 so that pass an LSI conduction test, the general purpose substrate 18 is cut so that the number Nx of the wires 18a matches the LSI pad number. Machine tool, such as a grinder, is used when cutting the general purpose substrate 18. After the substrate 18 is cut out, the contacts 6, which connection with the ground or the power supply must be reinforced, are connected to the ground layer 12 or the power supply layer 13 by the bonding wires 17a, 17b. This completes the contact probe 4.

The general purpose substrate 18 may also be used to produce LSI contact probes having a different number of the contact wires 11a (e.g., a contact probe having an Ny number of wires).

The first embodiment has the advantages described below.

(1) The general purpose substrate 18 has the wires 18a, which are patterned parallel to one another at a predetermined pitch. Each contact probe 4 is formed by cutting the general purpose substrate 18 so that the number of wires match the number of pads on the LSI chip 5. In this case, multiple types of contact probes having a different number of wires (the number of the contacts 6) may be produced from a single type of the general purpose substrate 18. In this manner, by using the substrate 18, which may be employed for general purposes, the productivity of the contact probes 4 increases and the production cost decreases. Further, part of the general purpose substrate 18 may be used to repair or replace the contact probe 4. The remaining general purpose substrate 18 may be used to repair or replace another contact probe. Thus, the cost for repairing and replacing the contact probes 4 decreases.

(2) The contacts 6 are connected to the ground layer 12 and the power supply layer 13 by the bonding wires 17a, 17b. The connection between the contacts 6 and the ground layer 12 and the connection between the contacts 6 and the power supply layer 13 are located near the LSI chip 5. This stabilizes the ground potential and the power supply potential (reinforces the ground and the power supply) of the probe card 1. Accordingly, the noise resistance of the probe card 1 and the quality of the conduction test are improved. The reinforcement of the ground and the reinforcement of the power supply may be customized in accordance with the type of the LSI chip 5.

Figure 7A:
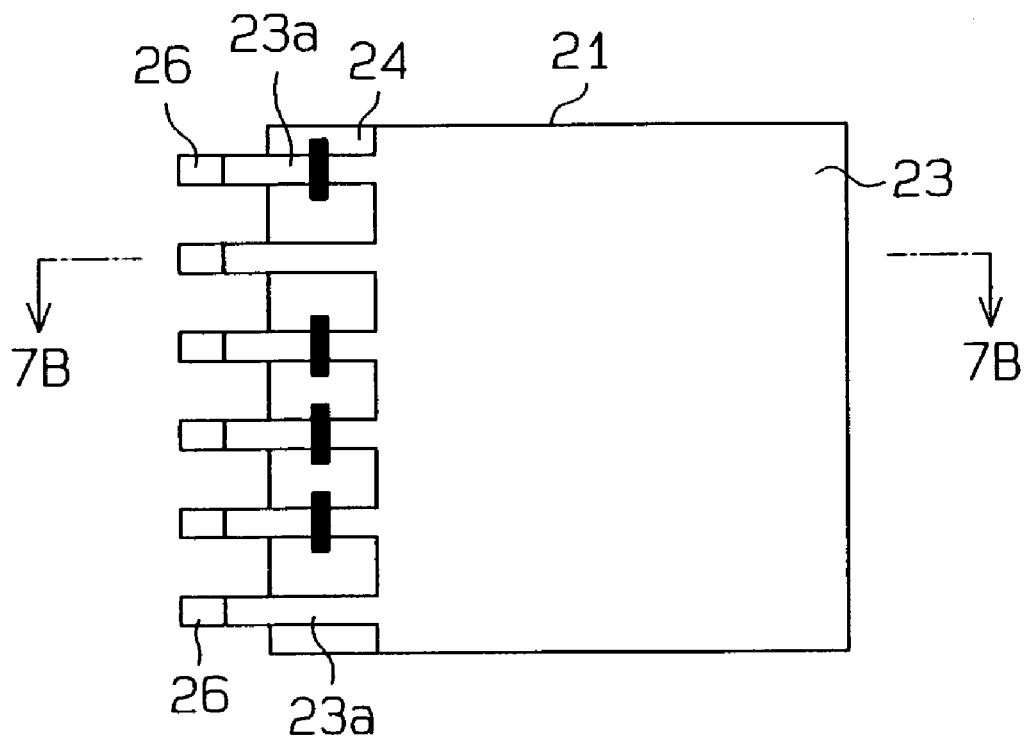
FIG. 7A is a plan view showing a contact probe according to a second embodiment of the present invention.
Figure 7B:
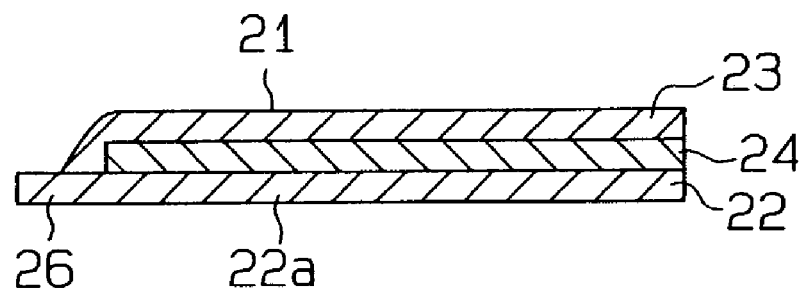
FIG. 7B is a cross-sectional view of the contact probe of FIG. 7A.

A contact probe 21 of a probe card according to a second embodiment of the present invention will now be discussed with reference to FIGS. 7a and 7B.

The contact probes 21 are flexible substrates having a signal layer 22, an insulation layer (polyimide resin layer) 24, and a ground layer 23. A plurality of contact wires 22a are arranged in parallel at a predetermined wiring pitch (44 µm) on the signal layer 22. A ground layer 23 is formed above the signal layer 22 with an insulation layer 24 arranged in between. The ground layer 23 is a copper, flat thin film. The wires 22a each have a distal end extending from the insulation layer 24. The distal end of each wire 22a functions as a contact 26, which contacts the LSI chip 5.

In the second embodiment, the connections between every contact 26 of the contact probe 21 and the ground are reinforced. That is, as shown in FIG. 7A, the ground layer 23 has a plurality of ground wires 23a extending from the distal end of the insulation layer 24. As shown in FIG. 7B, each ground wire 23a is connected to an associated one of the contact 26. This connects all of the contacts of the contact probe 21 to the ground layer 23 via the ground wires 23a. The ground wires 23a, which are connected to the contacts 26, disconnect the contacts, which provide a predetermined signal and supply high potential power to the LSI chip (FIG. 7A). In this manner, the contact probe 21 of the second embodiment is produced.

The second embodiment has the advantages described below.

The contact probe 21 of the second embodiment is produced from a general purpose substrate having a plurality of parallel wires. This decreases manufacturing costs.

The contacts 26 are connected to the ground layer 23 near the LSI chip 5. This reinforces ground connection in the probe card 1.

The ground wires 23a may be laser cut to easily customize the contact probe 21 in accordance with an LSI.

Figure 8A:
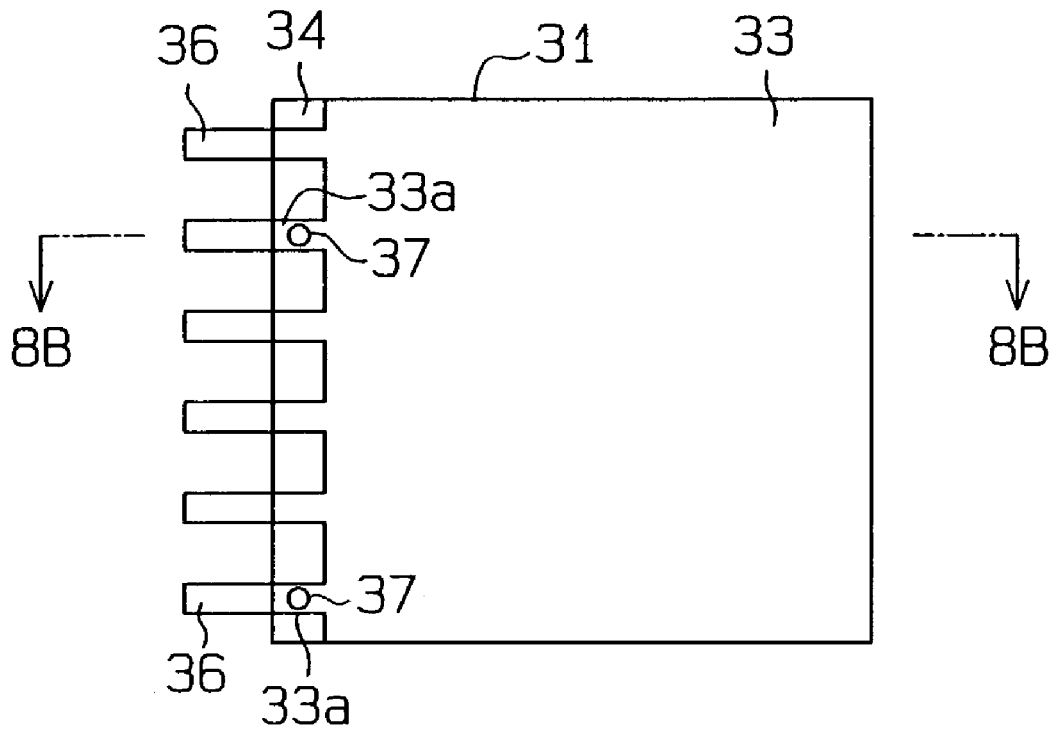
FIG. 8A is a plan view showing a contact probe according to a third embodiment of the present invention.
Figure 8B:
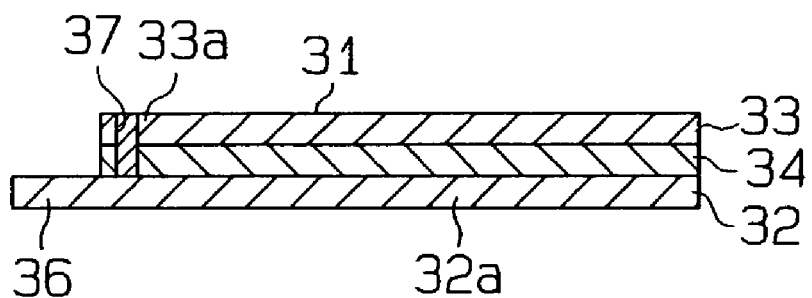
FIG. 8B is a cross-sectional view of the contact probe of FIG. 8A.

FIG. 8 shows a contact probe 31 of a probe card 1 according to a third embodiment of the present invention.

The contact probe 31 is a flexible substrate including a signal layer 32, an insulation layer 34, and a ground layer 33. A plurality of wires 32a are formed in parallel at a predetermined pitch on the signal layer 32. A ground layer 33 is formed above the signal layer 32 with an insulation layer 34 formed in between. The ground layer 33 is a flat thin film made of metal such as copper (Cu). The wires 32a each have a distal end that extends from the insulation layer 34. The distal end of each wire 32a functions as a contact 36 that contacts the LSI chip 5. The ground layer 33 has ground wires 33a formed in correspondence with the contacts 36.

In the third embodiment, through holes 37, which extend through the ground layer 33 and the insulation layer 34, are formed by laser beams near the distal end of the contact probe 31, or in the ground wires 33a near the contacts 36. A plating process is performed to charge the through holes with a conductive material. This electrically connects the contacts 36, which connection with the ground must be reinforced, with the ground wires 33a.

The third embodiment has the advantages described below.

The contact probe 31 of the third embodiment is produced from a general purpose substrate having a plurality of parallel wires. This decreases manufacturing costs.

The contacts 36 are connected to the ground layer 33 by way of the through holes 37 near the LSI chip 5. This reinforces ground connection in the probe card 1.

It should be apparent to those skilled in the art that the present invention may be embodied in many other specific forms without departing from the spirit or scope of the invention. Particularly, it should be understood that the present invention may be embodied in the following forms.

In the contact probes 21, 31 of FIGS. 7 and 8, a power supply layer may be formed on the ground layers 23, 33 by way of an insulation layer, and bonding wires may connect predetermined contacts to the power supply layer in the same manner as the contact probe of FIG. 5. In addition to reinforcing the ground, this reinforces the power supply. Thus, the noise resistance characteristic of the probe card 1 is further improved.

The general purpose substrate 18 of FIG. 6 has two columns of wires. However, the general purpose substrate 18 is not limited to such configuration and may have, for example, only a single row of the wires.

The present examples and embodiments are to be considered as illustrative and not restrictive, and the invention is not to be limited to the details given herein, but may be modified within the scope and equivalence of the appended claims.

What is claimed is:

1. A probe card for performing an electric test on a chip having a plurality of pads, the probe card comprising:
   a flexible substrate; and
   a flat, rectangular plate-shaped contact probe replaceable supported by the flexible substrate and having an outer end connected to the flexible substrate, an inner end including contacts to be contacted to the pads of the chip, and a signal layer including a plurality of linear contact wires arranged in parallel each other and perpendicular to the outer and inner ends and electrically connected to the flexible substrate, the contact probe being formed by cutting a general purpose insulation base material having a plurality of linear, parallel wires so that the number of the linear contact wires of the contact probe is equal to the number of the pads, and wherein the linear contact wires have distal ends functioning as the contacts, and wherein the distal ends of the contact wires are spaced each other at an equal pitch and the proximal ends of the contact wires are spaced each other at said equal pitch, and wherein the plurality of parallel wires of the general purpose insulation base material are parallel to one another throughout its length and arranged at said equal pitch and have a predetermined width throughout its length.

2. The probe card according to claim 1, wherein the contact probe includes:
   a signal layer in which the contact wires are formed;
   an insulation layer on which the signal layer is formed;
   a ground layer formed on the insulation layer, wherein the ground layer includes a plurality of ground wires, each associated with one of the contacts, and a through hole formed on the ground wires associated with predetermined ones of the contacts, the predetermined one of the contacts being electrically connected to the ground layer by the through holes.

3. The probe card according to claim 1, wherein the parallel wires are formed by conducting photolithography.

4. The probe card according to claim 1, wherein the number of the parallel wires of the insulation base material is greater than the number of the pads arranged on one side of the chip.

5. The probe card according to claim 1,
   wherein the flexible substrate is trapezoidal in shape with a wide outer end and a narrow inner end, said flexible substrate has a plurality of wires connecting said contact probe with a base plate.

6. The probe card according to claim 1, wherein the contact probe is flexible.

7. A probe card for performing an electric test on a chip having a plurality of pads, the probe card comprising:
   a flexible substrate;
   a flat, rectangular plate-shaped contact probe replaceable supported by the flexible substrate and having an outer end connected to the flexible substrate, an inner end including contacts to be contacted to the pads of the chip,, the contact probe including;
   a signal layer having a plurality of linear, parallel contact wires perpendicular to the outer and inner ends and electrically connected to the flexible substrate, wherein the contact wires have distal ends functioning as the contacts, wherein the distal ends of the contact wires are spaced each other at an equal pitch and proximal ends of the contact wires are spaced each other at said equal pitch;
   a first insulation layer formed on the signal layer;
   a ground layer formed on the first insulation layer; and
   a first bonding wire for connecting a predetermined one of the contacts to the ground layer, wherein the contact probe is formed by cutting a general purpose insulation base material having a plurality of linear, parallel wires that are parallel to one another throughout its length and arranged at said equal pitch and have a predetermined width throughout its length.

8. The probe card according to claim 7, wherein the contact probe includes a second insulation layer formed on the ground layer, a power supply layer formed on the insulation layer, and a second bonding wire for connecting the power supply layer to a second predetermined one of the contacts.

9. The probe card according to claim 7, wherein the parallel wires are formed by conducting photolithography.

10. A probe card for performing an electric test on a chip having a plurality of pads, the probe card comprising:
    a flexible substrate;
    a flat, rectangular plate-shaped contact probe replaceably supported by the flexible substrate and having an outer end connected to the flexible substrate, an inner end including contacts to be contacted to the pads of the chip, wherein the contact probe is formed by cutting a general purpose insulation base material having a plurality of linear, parallel wires that are parallel to one another throughout its length and arranged at an equal pitch and have a predetermined width throughout its length, the contact probe including;
    a signal layer having a plurality of linear, parallel contact wires perpendicular to the outer and inner ends and electrically connected to the flexible substrate, wherein the contact wires have distal ends functioning as the contacts, wherein the distal ends of the contact wires are spaced each other at an equal pitch and the proximal ends of the contact wires are spaced each other at said equal pitch;
    an insulation layer formed on the signal layer;
    a ground layer formed on the insulation layer;
    a plurality of ground wires for connecting the ground layer to the contacts, wherein a predetermined one of the ground wires connected to a predetermined one of the contacts is cut so that the predetermined one of the contacts is disconnected from the ground layer.

11. The probe card according to claim 10, wherein the parallel wires are formed by conducting photolithography.

12. The probe card according to claim 10,
wherein the flexible substrate is trapezoidal in shape with a wide outer end and a narrow inner end, said flexible substrate has a plurality of wires connecting said contact probe with a base plate.

13. The probe care according to claim 10, wherein the contact probe is flexible.

14. A rectangular general purpose insulation substrate for producing a flat, rectangular plate-shaped contact probe replaceable supported by a flexible substrate of a probe card, the rectangular general purpose insulation substrate comprising:

two sides opposite to one another; and a signal layer having a plurality of linear, parallel wires that are parallel to one another throughout its length and arranged at an equal pitch and have a predetermined width throughout its length, wherein the wires have distal ends at one of the two side and proximal ends at the other one of the two side, and wherein the rectangular general purpose insulation substrate is cut in accordance with the number of wires of the contact probe to produce the flat, rectangular plate-shaped contact probe.

15. The substrate according to claim 14, wherein the substrate is a flexible flat plate.

* * * * *